(12) United States Patent
Kato

(10) Patent No.: US 10,978,521 B2
(45) Date of Patent: Apr. 13, 2021

(54) DISPLAY DEVICE

(71) Applicant: Japan Display Inc., Minato-ku (JP)

(72) Inventor: Kengo Kato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/750,203

(22) Filed: Jan. 23, 2020

(65) Prior Publication Data

US 2020/0243611 A1 Jul. 30, 2020

(30) Foreign Application Priority Data

Jan. 25, 2019 (JP) .............................. JP2019-010972

(51) Int. Cl.
*G06F 3/044* (2006.01)
*H01L 27/32* (2006.01)
*H01L 51/52* (2006.01)

(52) U.S. Cl.
CPC .......... *H01L 27/323* (2013.01); *G06F 3/0446* (2019.05); *H01L 51/5253* (2013.01); *G06F 2203/04102* (2013.01)

(58) Field of Classification Search
CPC .. G06F 3/0412; G06F 3/04166; G06F 3/0446; G06F 3/044; G06F 3/016; G06F 3/03545; G06F 2203/04112; G06F 2203/04102; G06F 2203/04103; H01L 27/323; H01L 51/5253
See application file for complete search history.

(56) References Cited

U.S. PATENT DOCUMENTS

| 2015/0309358 A1* | 10/2015 | Nomura | G02F 1/13439 349/42 |
| 2016/0043340 A1* | 2/2016 | Ohara | H01L 51/5253 257/40 |
| 2017/0170248 A1 | 6/2017 | Sato | |
| 2017/0170428 A1* | 6/2017 | Huh | H01L 27/3246 |
| 2020/0020880 A1* | 1/2020 | Saida | H05B 33/02 |

FOREIGN PATENT DOCUMENTS

JP 2017-111184 A 6/2017

* cited by examiner

*Primary Examiner* — Robert J Michaud
(74) *Attorney, Agent, or Firm* — Oblon, McClelland, Maier & Neustadt, L.L.P.

(57) ABSTRACT

A display device according to an embodiment of the present invention includes: a plurality of pixels, each pixel having an opening; and a sealing film formed on the plurality of pixels, wherein the sealing film includes an inorganic film, and the inorganic film includes a wave portion whose cross section is a wave-shaped portion.

6 Claims, 8 Drawing Sheets

DISPLAY DEVICE

CROSS-REFERENCE TO RELATED APPLICATION

The present application claims priority from Japanese patent application JP 2019-010972 filed on Jan. 25, 2019, the content of which is hereby incorporated by reference into this application.

BACKGROUND OF THE INVENTION

1. Field of the Invention

One or more embodiments of the present invention relate to a display device.

2. Description of the Related Art

Since an organic electroluminescence (EL) layer of an organic EL display device is easily affected by moisture, a sealing film for preventing moisture from entering the organic EL layer may be provided. This sealing film preferably includes an inorganic film that does not allow moisture to permeate. On the other hand, in recent years, the development of flexible displays is in progress.

In order to provide a highly reliable display device that is less likely to cause cracks in an inorganic insulating layer and disconnection of a wiring during bending, JP 2017-111184 A describes a display device including a first substrate which is flexible and includes a plurality of pixels aligned in a matrix in a first direction and a second direction intersecting each other, a transistor layer which is disposed on the first substrate and in which at least one transistor is disposed in each of the plurality of pixels, a plurality of first wiring groups which extend in the first direction, are connected to each of a plurality of pixels aligned in the first direction among the plurality of pixels, and have undulations in a thickness direction of the first substrate, and a plurality of second wiring groups which extend in the second direction and are connected to each of a plurality of pixels aligned in the second direction among the plurality of pixels, and also describes facts that the first wiring group has undulations in the thickness direction of the first substrate, the undulations are caused by irregularities on a surface of a concavo-convex layer disposed below the first wiring group, and the undulations may have periodicity.

However, an inorganic material used for the inorganic film of the sealing film does not have high bending resistance.

SUMMARY OF THE INVENTION

One or more embodiments of the present invention have been made in view of the problems described above, and an object thereof is to provide a display device in which bending resistance of a sealing film is increased.

A display device according to an embodiment of the present invention includes: a plurality of pixels, each pixel having an opening; and a sealing film formed on the plurality of pixels, wherein the sealing film includes an inorganic film, and the inorganic film includes a wave portion whose cross section is a wave-shaped portion.

DETAILED DESCRIPTION OF THE INVENTION

Figure 1:
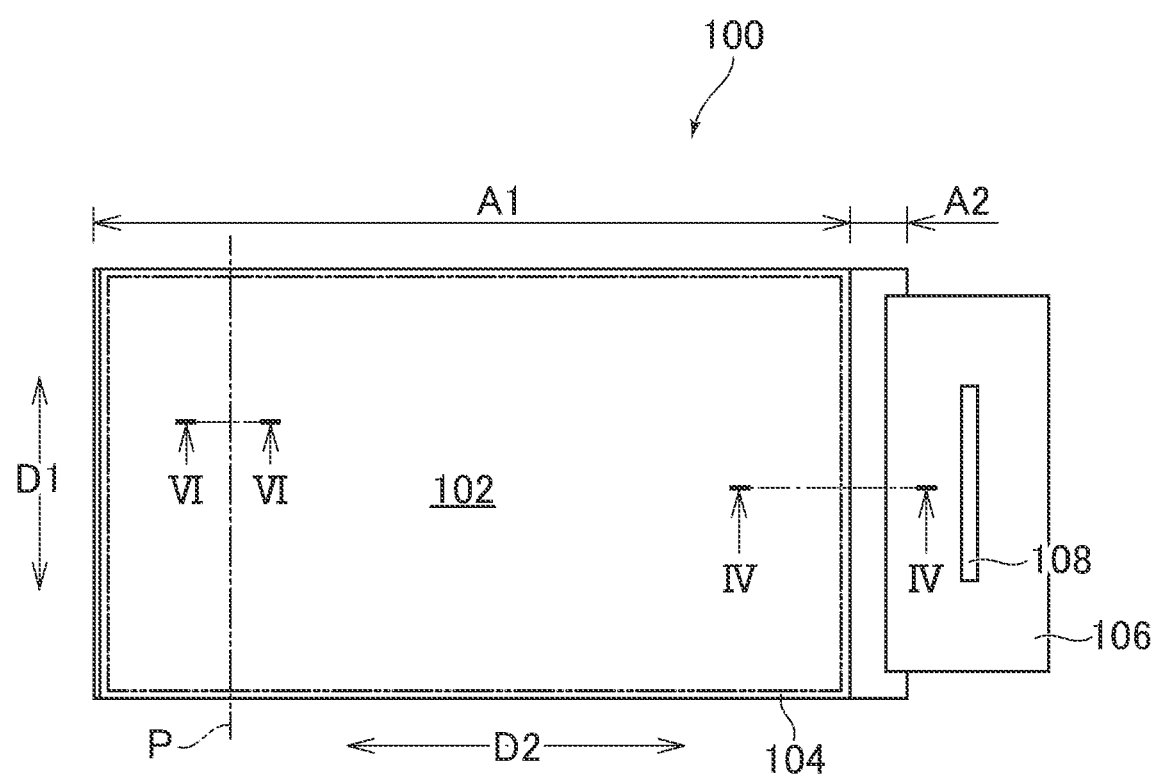
FIG. 1 is a schematic diagram schematically illustrating, in plan view, a display device according to an embodiment of the present invention.

Hereinafter, each embodiment of the present invention will be described with reference to the accompanying drawings. The disclosure in the present specification is merely an example, and matters that can be easily conceived by those skilled in the art through appropriate modifications while maintaining the gist of the invention are naturally included in the scope of the present invention.

The width, thickness, shape, and the like of each part may be schematically represented in the drawings as compared to the embodiment in order to clarify explanation, but are merely examples and do not limit the interpretation of the present invention. In the present specification and each drawing, elements similar to those described previously with reference to the previous drawings are denoted by the same reference numerals, and the detailed description thereof may be omitted as appropriate. In the reference numerals in which alphabets are added to numbers, when distinguishment between reference numerals by the alphabets is not necessary, the reference numerals may be indicated only by the numbers without the alphabets.

Furthermore, in this specification, when prescribing the positional relationship between a certain component and another component, terms of "on", "above" and "below" include not only a case where the other component is positioned immediately above or immediately below the certain component, but also a case where still another component is interposed between the certain component and the other component, unless otherwise specified.

FIG. 1 is a schematic diagram schematically illustrating, in plan view, an example of a display device 100 according to this embodiment. In this embodiment, an example in which the display device 100 is a top emission type organic EL display device will be described.

The display device 100 includes a display region 102 and a frame region 104. The display region 102 includes a plurality of pixels disposed in a matrix. Each pixel includes an opening 200 (see FIGS. 4 and 6). Each pixel emits light from the opening 200.

Each pixel may include a plurality of sub-pixels. In this embodiment, each pixel includes a plurality of sub-pixels that emit light in different colors. Specifically, each pixel includes a sub-pixel that emits red light, a sub-pixel that emits green light, and a sub-pixel that emits blue light.

When each pixel includes a plurality of sub-pixels, each sub-pixel has the opening 200. Accordingly, each pixel includes a plurality of openings 200 corresponding to the plurality of sub-pixels. Thus, each sub-pixel emits light from the opening 200.

The frame region 104 is a region surrounding the display region 102. A flexible printed circuit board 106 is connected to the display device 100. On the flexible printed circuit board 106, a drive integrated circuit 108 for driving an element for displaying an image is mounted.

For example, the drive integrated circuit 108 applies a potential for conducting between a source and a drain to a scanning signal line 28 (see FIG. 3) of a pixel transistor disposed corresponding to each of the plurality of sub-pixels constituting one pixel and supplies a current corresponding to a gradation value of the sub-pixel to a video signal line 30 (see FIG. 3) of each pixel transistor.

In the display device 100, a portion including at least a part (part or all) of the display region 102 is flexible. That is, the display device 100 includes a portion that can be bent (hereinafter, referred to as a "bending region"), and the bending region includes at least a part of the display region 102.

Specifically, in the example illustrated in FIG. 1, the display device 100 includes the display region 102 having a length in a first direction D1 and a length in a second direction D2 perpendicular to the first direction D1, and the length in the second directions D2 is larger than the length in the first direction D1. The display region 102 of the display device 100 can be bent at a position of a two-dot chain line P extending in the first direction D1 in the drawing.

The display device 100 includes the flexible printed circuit board 106 on one side of the display region 102 in the second direction D2. Further, the display device 100 includes a flexible board 40 (see FIGS. 4 and 6), and the flexible board 40 includes a first region A1 including the display region 102 and a second region A2 adjacent to the first region A1 in the second direction D2. The first region A1 of the flexible board 40 includes a display circuit layer 50 (see FIGS. 4 and 6) for displaying an image.

Figure 2A:
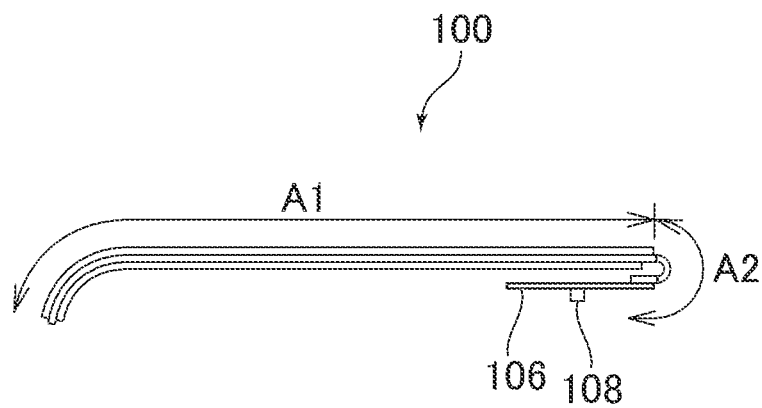
FIG. 2A is a schematic diagram schematically illustrating, in side view, a state in which a part of a display region of the display device according to the embodiment of the present invention is bent.

FIG. 2A is a schematic diagram schematically illustrating a state where the bending region of the display device 100 illustrated in FIG. 1 is bent. In the example illustrated in FIG. 2A, the bending region of the display device 100 includes a part of the display region 102 and a part of the frame region 104. The bending region of the display device 100 may include the entire display region 102.

In the example illustrated in FIG. 2A, an end portion of the display device 100 that does not include the display region 102 can also be bent. That is, as illustrated in FIG. 2A, by bending the second region A2 constituting a portion between the display region 102 and the flexible printed circuit board 106 in the flexible board 40 (see FIGS. 4 and 6), a part (in the example illustrated in FIG. 2A, the end portion including the flexible printed circuit board 106) of the display device 100 can be overlapped with a portion including the display region 102 (in other words, the flexible printed circuit board 106 is disposed on the back side of the display region 102 of the display device 100), which enables downsizing of the display device 100.

Figure 2B:
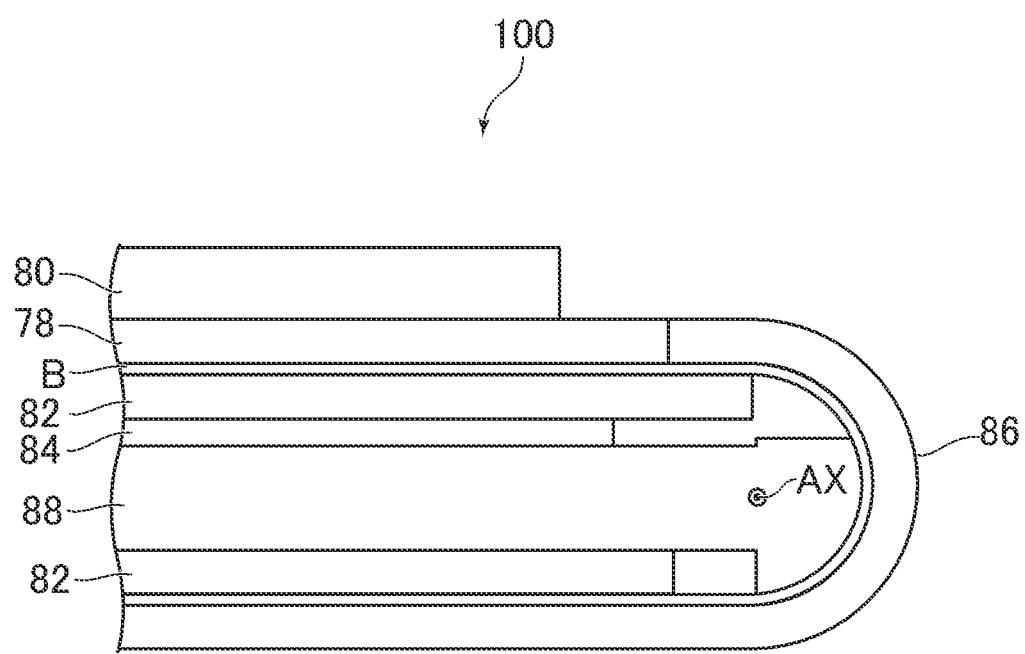
FIG. 2B is a schematic diagram schematically illustrating, in side view, use form of the display device according to the embodiment of the present invention.

FIG. 2B illustrates the use form of the display device 100. The display device 100 includes a main body B including the flexible board 40 and the display circuit layer 50 (see FIGS. 4 and 6). In the first region A1 (see FIGS. 1 and 2) including the display region 102, a front lamination film 78 and a polarizing plate 80 are provided on the front side of the main body B. Adjacent to the front lamination film 78 and the polarizing plate 80, an organic insulating film 86 is provided in the second region A2 (see FIGS. 1 and 2) that does not include the display region 102. The main body B (flexible board 40) is bent around an axis AX extending in the first direction D1 (see FIG. 1). A spacer 88 is disposed on the inner side of the bent portion to restrict the curvature from becoming too large. On the back side of the main body B except at least the bent portion, a back lamination film 82 is attached.

Figure 3:
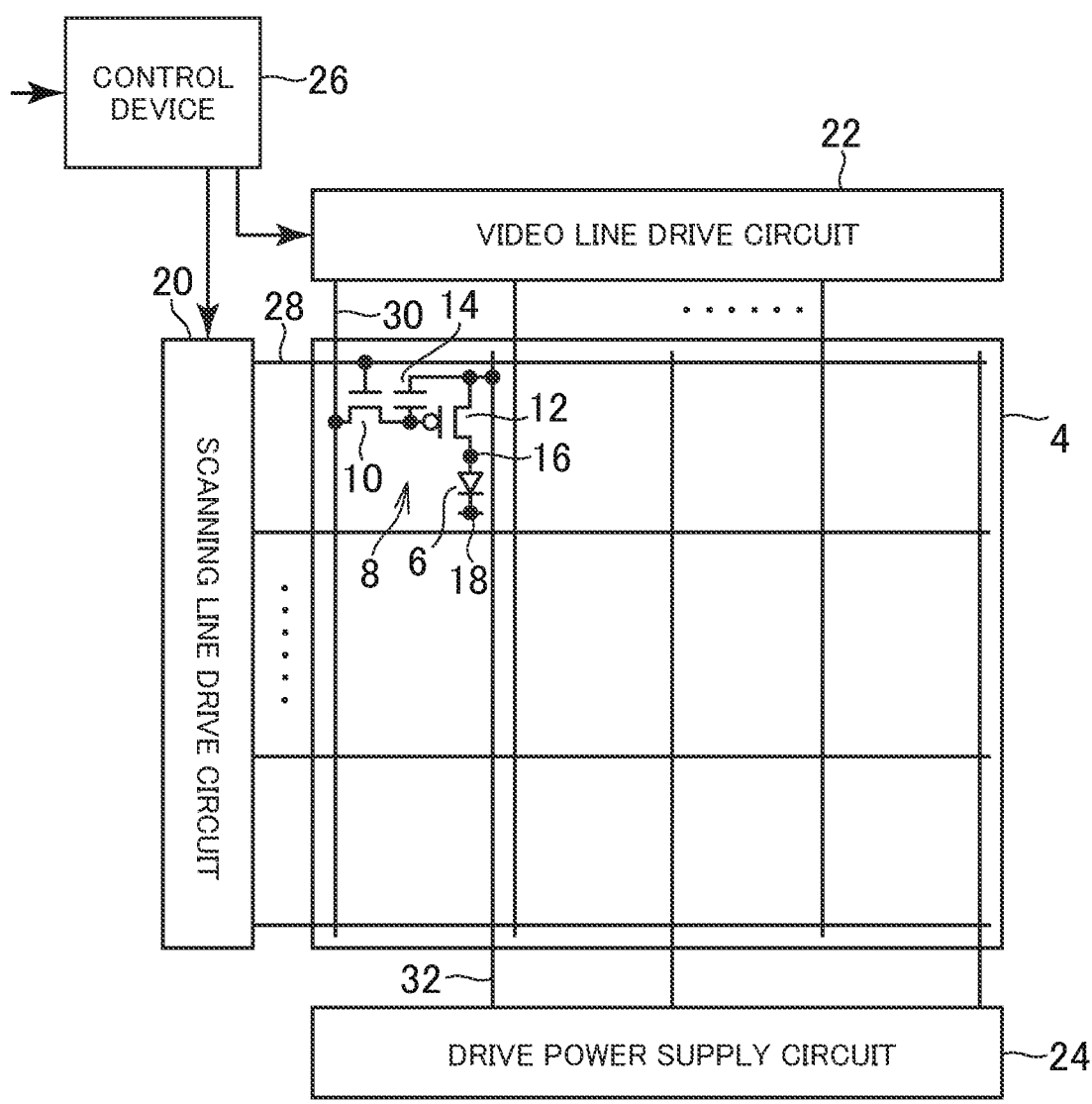
FIG. 3 is a circuit diagram of the display device according to the embodiment of the present invention.

FIG. 3 is a circuit diagram of the display device 100. The display device 100 includes a pixel array portion 4 that displays an image and a drive unit that drives the pixel array portion 4. The pixel array portion 4 includes an organic light-emitting diode (OLED) 6 and a pixel circuit 8 provided corresponding to each sub-pixel.

The pixel circuit 8 includes a lighting thin film transistor (TFT) 10, a drive TFT 12, and a capacitor 14. The drive unit includes a scanning line drive circuit 20, a video line drive circuit 22, a drive power supply circuit 24, and a control device 26. The drive unit drives the pixel circuit 8 and controls light emission of the OLED 6.

The scanning line drive circuit 20 is connected to the scanning signal line 28 provided for each horizontal arrangement (sub-pixel row) of sub-pixels. The scanning line drive circuit 20 sequentially selects the scanning signal line 28 according to a timing signal input from the control device 26, and applies a potential for turning on the lighting TFT 10 to the selected scanning signal line 28.

The video line drive circuit 22 is connected to the video signal line 30 provided for each vertical arrangement (sub-pixel column) of sub-pixels. The video line drive circuit 22 receives a video signal from the control device 26, and applies a potential corresponding to the video signal of the selected sub-pixel row to each video signal line 30, in accordance with the selection of the scanning signal line 28 by the scanning line drive circuit 20. This potential is written into the capacitor 14 via the lighting TFT 10 in the selected sub-pixel row. The drive TFT 12 supplies a current corresponding to the written potential to the OLED 6, whereby the OLED 6 of the sub-pixel corresponding to the selected scanning signal line 28 emits light.

The OLED 6 includes an anode 16, a cathode 18, and an EL layer 220 (see FIGS. 4 and 6) formed between the anode 16 and the cathode 18. In this embodiment, the anode 16 is formed as an individual electrode in each sub-pixel, and the cathode 18 is formed as a common electrode across a plurality of pixels.

The anode 16 is electrically connected to an anode power supply line 32 disposed for each sub-pixel column via the drive TFT 12. The anode power supply line 32 is electrically connected to the drive power supply circuit 24. The drive power supply circuit 24 applies a high potential to the anode 16 via the anode power supply line 32. That is, a potential based on the potential of the cathode 18 is applied to the anode 16.

The cathode 18 is electrically connected to a cathode power supply line (not illustrated). A low potential (potential serving as a reference for the potential to be applied to the anode 16) applied to the cathode 18 is supplied to the cathode power supply line, or the cathode power supply line is grounded. In the former case, the cathode power supply line is electrically connected to the drive power supply circuit 24, and the drive power supply circuit 24 applies a low potential to the cathode 18 through the cathode power supply line. The cathode power supply line is disposed, for example, in the frame region 104 (see FIG. 1).

The drive power supply circuit 24 supplies a current to the OLED 6 through the anode power supply line 32, the cathode power supply line, and the drive TFT 12 of the selected sub-pixel row. As a result, the EL layer 220 (see FIGS. 4 and 6) of the OLED 6 emits light.

Figure 4:
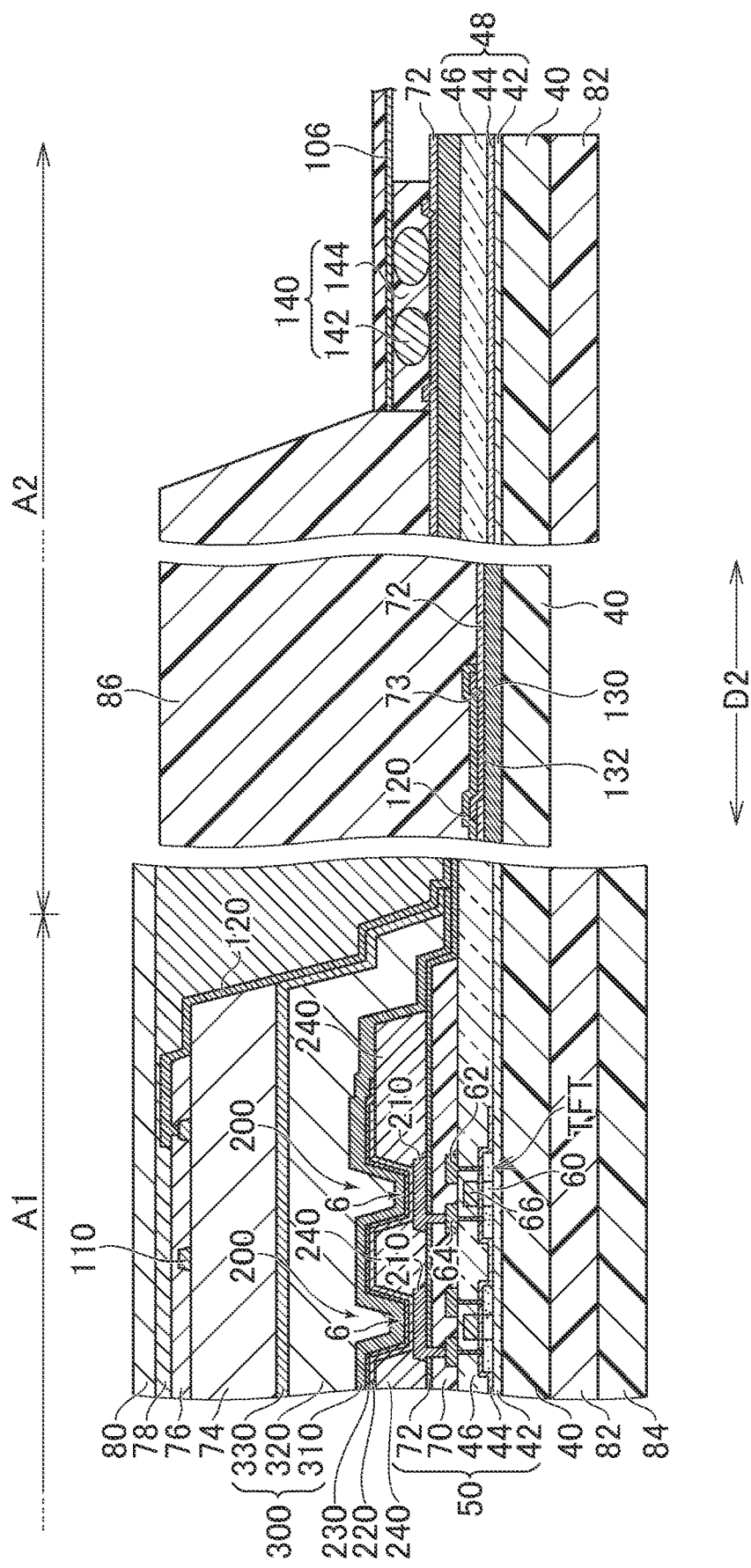
FIG. 4 is a schematic diagram schematically illustrating a cross-section of the display device taken along line IV-IV illustrated in FIG. 1.

FIG. 4 is an enlarged view of a cross-section taken along line IV-IV of the display device 100 illustrated in FIG. 1. The display device 100 includes the flexible board 40 as described above. The flexible board 40 includes the first region A1 including the display region 102 and the second region A2 adjacent to the first region A1 in the second direction D2.

An undercoat layer 42 made of an inorganic insulating material is formed on the flexible board 40 so as to be a barrier against impurities, and a semiconductor layer 60 is formed thereon. A source electrode 62 and a drain electrode 64 are electrically connected to the semiconductor layer 60. A gate insulating film 44 made of an inorganic insulating material is formed on the semiconductor layer 60 so as to cover the semiconductor layer 60. On the gate insulating film 44, a gate electrode 66 is formed and an interlayer insulating film 46 made of an inorganic insulating material is formed so as to cover the gate electrode 66. The source electrode 62 and the drain electrode 64 penetrate the gate insulating film 44 and the interlayer insulating film 46. The semiconductor layer 60, the source electrode 62, the drain electrode 64, and the gate electrode 66 constitute at least a part of the TFT.

The undercoat layer 42, the gate insulating film 44, and the interlayer insulating film 46 disposed in the first region A1 reach at least a part of the second region A2. In the second region A2, the undercoat layer 42, the gate insulating film 44, and the interlayer insulating film 46 are laminated, and a first inorganic insulating film 48 made entirely of an inorganic insulating material is formed by adding other inorganic insulating films as necessary. That is, the first inorganic insulating film 48 is composed of a plurality of insulating layers.

In the first region A1, a planarization layer 70 is provided on the interlayer insulating film 46 so as to cover the TFT. The planarization layer 70 is made of an organic insulating material. The planarization layer 70 is provided in the first region A1 where the display circuit layer 50 is formed, but is not provided in the second region A2. A second inorganic insulating film 72 is formed on the planarization layer 70. The second inorganic insulating film 72 exceeds the planarization layer 70, and is in contact with and overlaps the interlayer insulating film 46 below the planarization layer 70. That is, the planarization layer 70 with high moisture permeability is shielded from moisture by being sandwiched between the second inorganic insulating film 72 and the interlayer insulating film 46 with low moisture permeability.

On the second inorganic insulating film 72, a plurality of lower electrodes 210 configured to correspond to each of a plurality of unit pixels are provided. The lower electrode 210 is one of a pair of electrodes for constituting a capacitor for storing an image signal. The planarization layer 70 is formed so that an upper surface of at least the portion where the lower electrode 210 is provided in the second inorganic insulating film 72 is planarized. The lower electrode 210 penetrates the second inorganic insulating film 72 and the planarization layer 70 and is electrically connected to one (drain electrode 64 in the example illustrated in FIG. 4) of the source electrode 62 and the drain electrode 64 on the semiconductor layer 60.

On the second inorganic insulating film 72 and the lower electrode 210, a rib 240 made of an organic insulating material is formed. The rib 240 is placed on the peripheral edge portion of the lower electrode 210 and is formed so as to open a part (for example, the central portion) of the lower electrode 210. The rib 240 forms a bank surrounding a part of the lower electrode 210. The lower electrode 210 is a part of the OLED 6. The OLED 6 further includes an upper electrode 230 facing the plurality of lower electrodes 210, and the organic EL layer 220 sandwiched between the lower electrode 210 and the upper electrode 230.

The OLED 6 is sealed by a sealing film 300 and shielded from moisture. The sealing film 300 has a structure in which a pair of inorganic films (a lower-layer inorganic film 310 and an upper-layer inorganic film 330) made of an inorganic material sandwich an organic film 320. At least one of the pair of inorganic films 310 and 330 is provided so as to exceed the rib 240, and is in contact with and overlaps the second inorganic insulating film 72 below the rib 240. That is, the rib 240 with high moisture permeability is shielded from moisture by being sandwiched between at least one of the inorganic films 310 and 330 and the second inorganic insulating film 72 with low moisture permeability. A touch panel electrode 110 is provided on the sealing film 300 for performing touch sensing via a planarization layer 74.

Figure 5A:
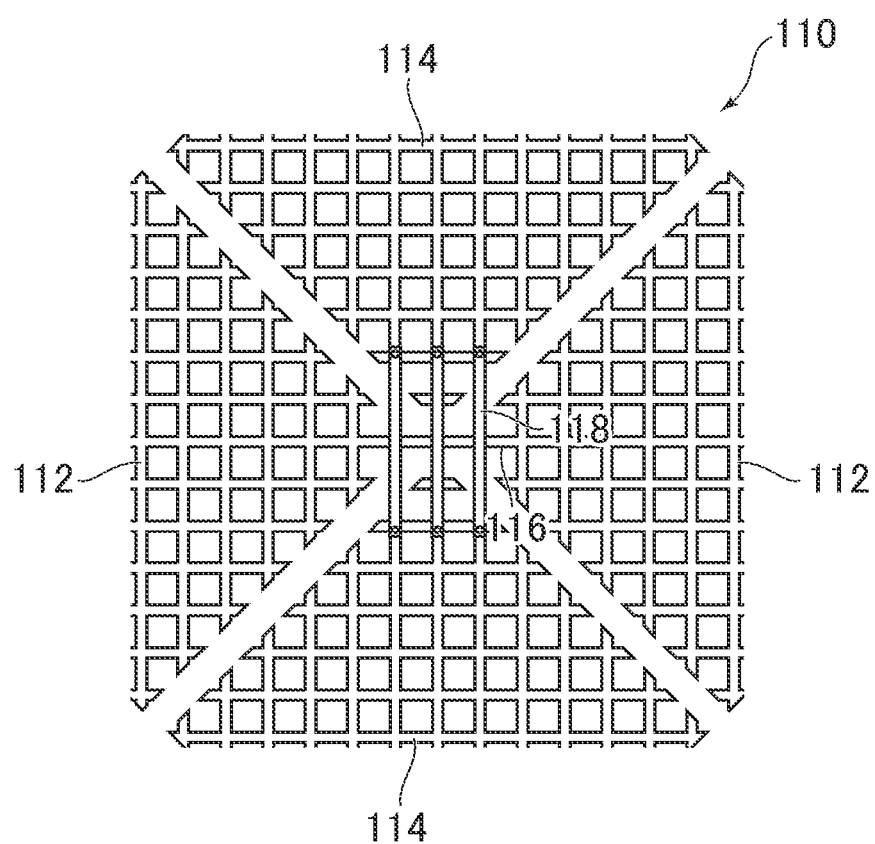
FIG. 5A is a schematic diagram schematically illustrating an example of a touch electrode in plan view.

FIG. 5A is a plan view in which a part of the touch panel electrode 110 is enlarged. The touch panel electrode 110 includes a first pad 112 and a second pad 114. One of the first pad 112 and the second pad 114 is on a side transmitting the touch sensing signal, and the other is on a side receiving the touch sensing signal. Adjacent first pads 112 or adjacent second pads 114 (first pads 112 in the example illustrated in FIG. 5A) are connected by a connection wiring 116. Adjacent first pads 112 or adjacent second pads 114 (second pads 114 in the example illustrated in FIG. 5A) are connected by a jumper wiring 118.

Figure 5B:
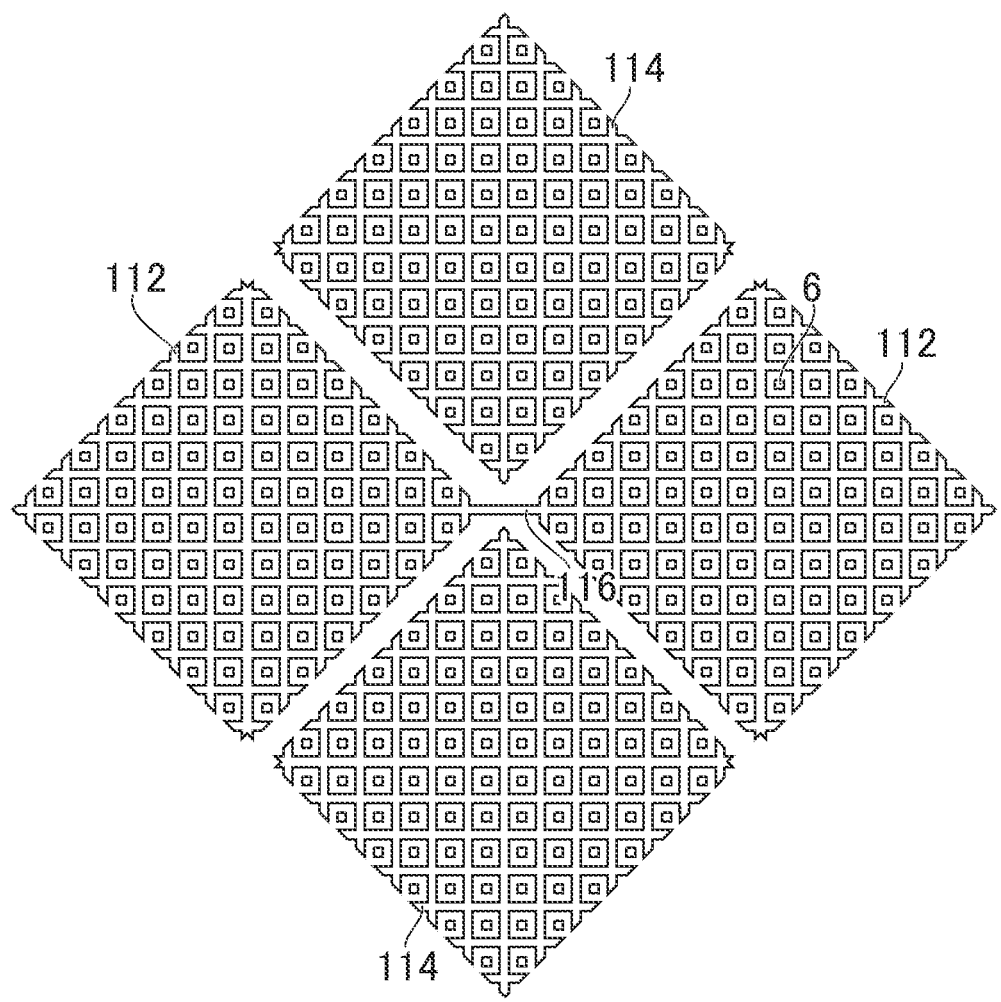
FIG. 5B is a schematic diagram schematically illustrating, in plan view, a first pad and a second pad of the touch electrode.

FIG. 5B is a diagram illustrating the first pad 112 and the second pad 114. In the example illustrated in FIG. 5B, an outer shape of each of the first pad 112 and the second pad 114 is a diamond shape or a rectangle. The first pad 112 and the second pad 114 are formed in the same layer. For this reason, when the incident external light is reflected, optical path lengths become equal, a difference in reflection hardly appears, and it is difficult to be visually recognized. Further, each of the first pad 112 and the second pad 114 is formed in a mesh shape, and the OLEDs 6 are arranged in the mesh. Accordingly, even if the first pad 112 and the second pad 114 are made of metal, light is not blocked. A dummy electrode (not illustrated) that is not electrically connected to any of the first pad 112 and the second pad 114 may be disposed between the adjacent first pad 112 and second pad 114. By disposing the dummy electrode, capacitive coupling between the first pad 112 and the second pad 114 can be appropriately reduced, and as a result, a capacitance change due to the touch can be relatively increased.

As illustrated in FIG. 4, a touch interlayer insulating film 76 is interposed between a layer constituting the first pad 112 and the second pad 114 and a layer constituting the jumper wiring 118 (see FIG. 5A). In the example illustrated in FIG. 4, a touch wiring 120 is connected to the touch panel electrode 110 passing through the touch interlayer insulating film 76. The touch wiring 120 is provided on the touch interlayer insulating film 76, and is formed in the same layer as the jumper wiring 118.

Figure 5C:
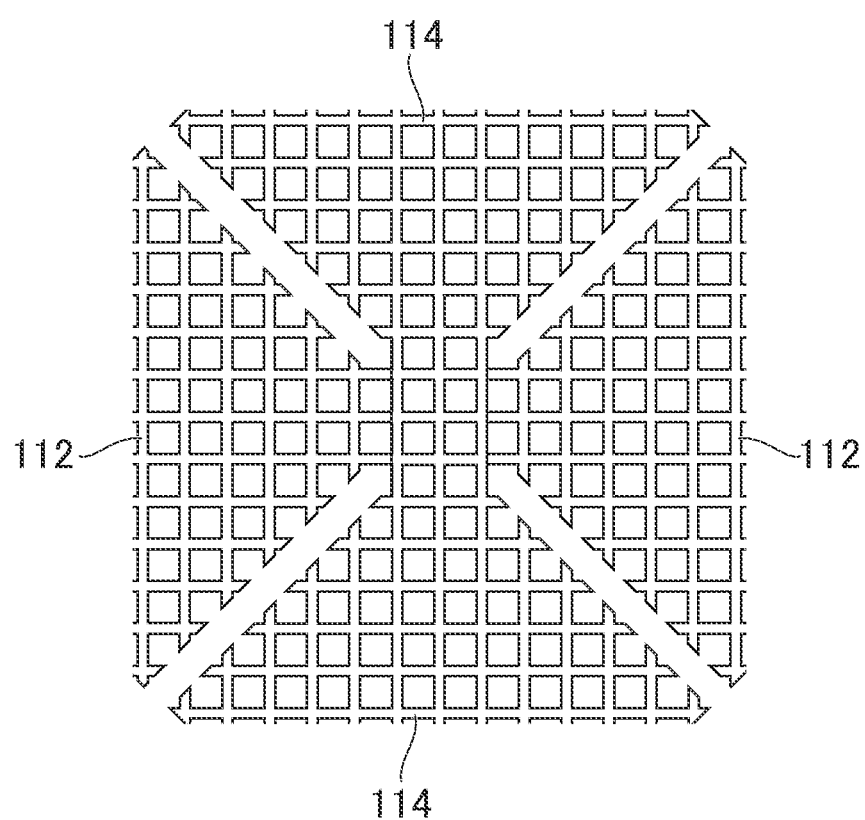
FIG. 5C is a schematic diagram schematically illustrating, in plan view, another example of the touch electrode.

FIG. 5C is a plan view illustrating a modification of the touch panel electrode 110. In the example illustrated in FIG. 5C, a plurality of first pads 112 and a plurality of second pads 114 are formed in different layers, and the touch interlayer insulating film 76 is interposed therebetween. In this structure, since it is not necessary to open a contact for connecting the jumper wiring 118 (see FIG. 5A), defects in a process such as defective opening and generation of particles are unlikely to occur.

As illustrated in FIG. 4, in the first region A1, the front lamination film 78 is attached so as to cover the touch panel electrode 110, and the polarizing plate 80 is attached thereon. On the back surface of the flexible board 40, the back lamination film 82 is attached and a heat diffusion sheet 84 is attached below the back lamination film 82, in the first region A1. Also, in the second region A2, the back lamination film 82 is attached at a position that overlaps at least a connection portion with the flexible printed circuit board 106.

A plurality of wirings 130 are laminated on the flexible board 40 in the second region A2. The plurality of wirings 130 extend in the second direction D2 from the first region A1. The plurality of wirings 130 are aligned in the first direction D1 so as not to be electrically connected to each other. The plurality of wirings 130 include wirings connected to the touch panel electrode 110. For example, the wiring 130 illustrated in FIG. 4 is connected to the touch wiring 120. Specifically, in the second region A2, the second inorganic insulating film 72 extends so as to be interposed between the touch wiring 120 and the wiring 130, and the touch wiring 120 and the wiring 130 are electrically connected via an opening 73 of the second inorganic insulating film 72.

A transparent conductive film 132 such as indium tin oxide (ITO) is interposed between the touch wiring 120 and the wiring 130. The transparent conductive film 132 is formed at the same time as a film constituting a part of the lower electrode 210. The organic insulating film 86 is formed on the second inorganic insulating film 72 in the second region A2. The plurality of wirings 130 are electrically connected to the flexible printed circuit board 106 at end portions. This electrical connection is performed via an anisotropic conductive film 140 (more specifically, for example, conductive particles 142 contained in the anisotropic conductive film 140). Further, a mechanical connection is achieved by a thermosetting resin 144 (matrix portion surrounding the conductive particles 142) contained in the anisotropic conductive film 140.

In this embodiment, in the second region A2 of the flexible board 40, there is a region (in the example illustrated in FIG. 4, a region where the wiring 130 is formed on the flexible board 40 without the first inorganic insulating film 48 interposed therebetween) where the first inorganic insulating film 48 does not exist. By not providing the relatively hard first inorganic insulating film 48, a part of the flexible board 40 is easily bent.

Figure 6:
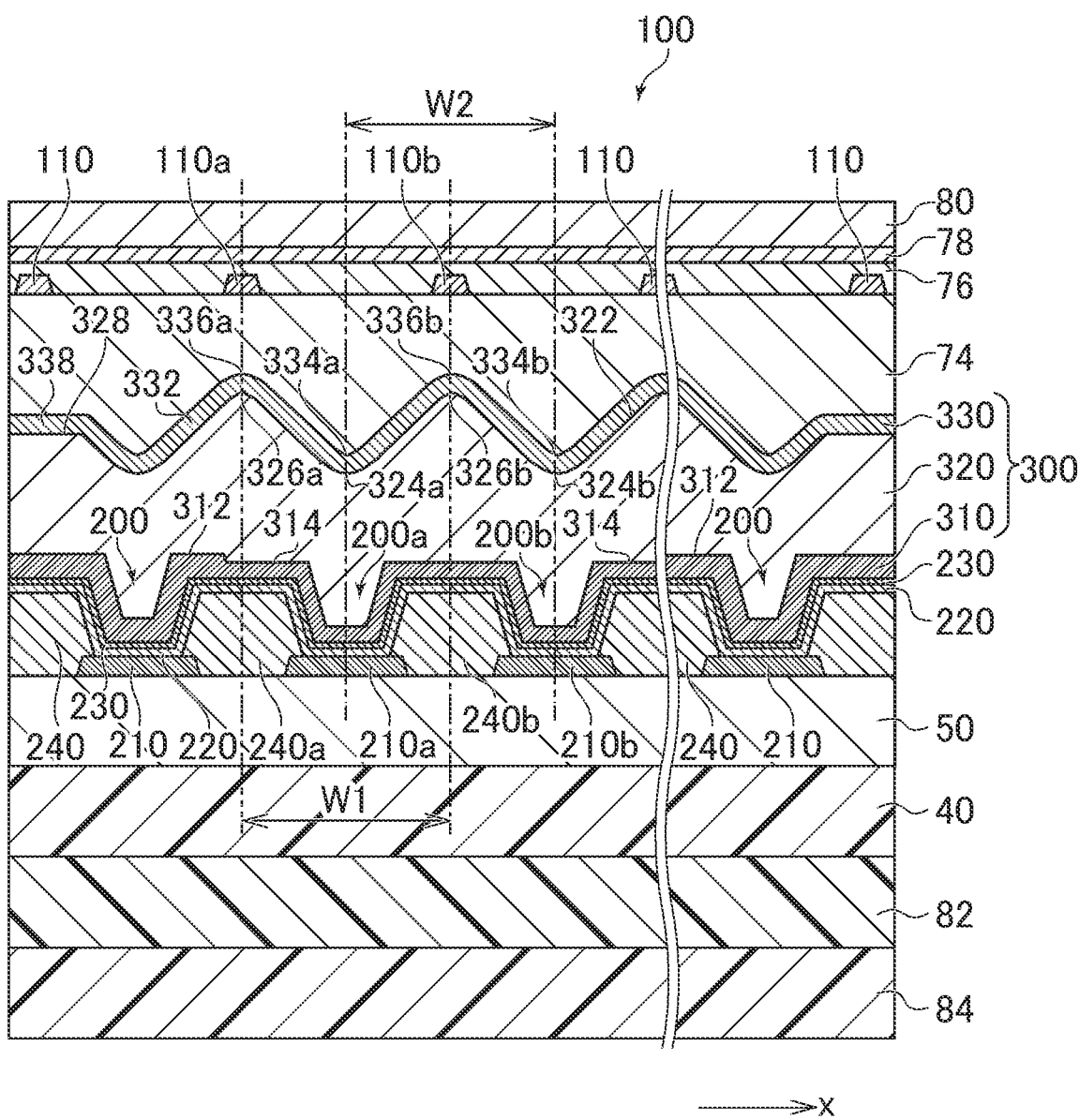
FIG. 6 is a schematic diagram schematically illustrating a cross-section of the display device taken along line VI-VI illustrated in FIG. 1.

FIG. 6 is a schematic diagram schematically illustrating a cross-section of the display device 100 taken along line VI-VI illustrated in FIG. 1. That is, FIG. 6 schematically illustrates a cross-section of a part of the display region 102 included in the bending region of the display device 100.

As illustrated in FIG. 6, the display device 100 includes the display circuit layer 50 formed on the flexible board 40, the plurality of lower electrodes 210 formed on the display circuit layer 50, the organic EL layer 220 formed on the plurality of lower electrodes 210, and the upper electrode 230 formed on the EL layer 220.

The display circuit layer 50 is a layer formed between the flexible board 40 and the lower electrode 210, and as illustrated in FIG. 4, includes TFTs (lighting TFT 10 and drive TFT 12 (see FIG. 3)) for controlling light emission in the organic EL layer 220.

The lower electrode 210 is electrically connected to the TFT of the display circuit layer 50. That is, as illustrated in FIG. 4, the lower electrode 210 is electrically connected to the source electrode 62 or the drain electrode 64 (in the example illustrated in FIG. 4, the drain electrode 64) of the TFT formed in the display circuit layer 50 via a contact hole formed in the display circuit layer 50.

In this embodiment, the lower electrode 210 is formed as the anode 16 (see FIG. 3). The lower electrode 210 is formed as a reflection electrode. Specifically, the lower electrode 210 has a three-layer laminated structure composed of, for example, ITO, Ag, and ITO layers.

The ribs 240 are formed between adjacent lower electrodes 210. The rib 240 is formed as a partition wall that partitions adjacent sub-pixels. That is, in the example illustrated in FIG. 6, the rib 240 is formed from a position between the adjacent lower electrodes 210 to an outer peripheral portion of the lower electrode 210. The rib 240 is formed of an insulating material. Specifically, the rib 240 is formed of an organic material such as photosensitive acrylic, for example.

The region surrounded by the ribs 240 in each sub-pixel is the opening 200 of each sub-pixel. That is, each of the plurality of sub-pixels has the opening 200 surrounded by the ribs 240.

The organic EL layer 220 includes alight emitting layer that emits light for image display by the display device 100. For example, the light emitting layer emits light by recombination of holes injected from the lower electrode 210 and electrons injected from the upper electrode 230.

The organic EL layer 220 may be a single layer composed of a light emitting layer, or may be formed in multiple layers including the light emitting layer and other layers. Examples of the other layers include one or more layers selected from a group consisting of a hole injection layer, a hole transport layer, an electron transport layer, and an electron injection layer. In this embodiment, the organic EL layer 220 includes a light emitting layer and other layers.

Specifically, the organic EL layer 220 includes, for example, one or more layers selected from a group consisting of the hole injection layer and the hole transport layer interposed between the lower electrode 210 and the light emitting layer. The hole injection layer or the hole transport layer may be provided separately for each lower electrode 210, or may be provided continuously over the entire display region 102 illustrated in FIG. 1. The hole injection layer may be in contact with the lower electrode 210 and the rib 240.

The organic EL layer 220 includes, for example, one or more layers selected from a group consisting of the electron injection layer and the electron transport layer interposed between the upper electrode 230 and the light emitting layer. The electron injection layer or the electron transport layer may be provided separately for each lower electrode 210, or may be provided continuously over the entire display region 102 illustrated in FIG. 1. The electron injection layer may be in contact with the upper electrode 230.

The organic EL layer 220 may be formed for each sub-pixel or may be formed across a plurality of sub-pixels. In this embodiment, as illustrated in FIG. 6, the organic EL layer 220 is formed across a plurality of sub-pixels. That is, the organic EL layer 220 is formed on the plurality of lower electrodes 210 and the ribs 240 formed between the adjacent lower electrodes 210.

In this embodiment, the organic EL layer 220 is formed across the plurality of sub-pixels, but the light emitting layer is formed for each sub-pixel and the other layers are formed across the plurality of sub-pixels. That is, alight emitting layer that emits light of a specific color (for example, any one of red, green, and blue) is formed on each lower electrode 210, while other layers are formed across the plurality of lower electrodes 210. However, when the organic EL layer 220 is formed across a plurality of sub-pixels, all the layers including the light emitting layer may be formed across the plurality of sub-pixels.

In this embodiment, as described above, each pixel includes a plurality of sub-pixels including light emitting layers having different colors, but is not limited thereto. Each pixel may include, for example, a plurality of sub-pixels including light emitting layers of the same color (for example, white), and color filters that extract different colors may be disposed at positions that respectively correspond to the plurality of sub-pixels.

The upper electrode 230 is formed as a common electrode formed across a plurality of pixels. That is, the upper electrode 230 is formed across the plurality of sub-pixels, formed across the plurality of lower electrodes 210, and formed across the plurality of openings 200.

In this embodiment, the upper electrode 230 is formed as the cathode 18 (see FIG. 3). In this embodiment, since the display device 100 is atop emission type display device, the upper electrode 230 is formed as a light transmissive electrode. That is, the upper electrode 230 is preferably formed as a transparent electrode, for example. The transparent electrode is formed using a transparent conductive material. As the transparent conductive material, for example, indium zinc oxide (IZO) and/or ITO is used. The upper electrode 230 may be formed, for example, as a metal thin film electrode having light transmittance. The metal thin film electrode is preferably formed using, for example, AgMg.

In the display device 100, the lower electrode 210, the organic EL layer 220, and the upper electrode 230 described above constitute the OLED 6 (see FIG. 3). That is, a current is allowed to flow between the lower electrode 210 and the upper electrode 230, thereby causing the light emitting layer included in the organic EL layer 220 sandwiched between the lower and upper electrodes 210 and 230 to emit light.

As a result, the opening 200 of each sub-pixel emits light in the display region 102 (see FIG. 1) of the display device 100. Specifically, for example, when each pixel includes three sub-pixels, the opening 200 of a first sub-pixel emits red light, the opening 200 of a second sub-pixel emits green light, and the opening 200 of a third sub-pixel emits blue light, in each pixel. The display device 100 can display a full-color image by such light emission of a plurality of colors.

The display device 100 includes the sealing film 300 formed on the plurality of pixels. In this embodiment, the sealing film 300 is formed so as to cover the entire display region 102.

The sealing film 300 is formed in order to suppress moisture from entering the organic EL layer 220 from the outside. For this reason, the sealing film 300 includes the pair of inorganic films 310 and 330 as illustrated in FIG. 6. The inorganic films 310 and 330 are formed of an inorganic material that does not allow moisture to permeate. As such an inorganic material, for example, an inorganic compound containing nitrogen and silicon (for example, one or more compounds selected from a group consisting of SiN (for example, $Si_3N_4$), SiCN, and SiON) is preferably used.

In the example illustrated in FIG. 6, the sealing film 300 includes the lower-layer inorganic film 310 formed on the upper electrode 230, the organic film 320 formed on the lower-layer inorganic film 310, and the upper-layer inorganic film 330 formed on the organic film 320.

The lower-layer inorganic film 310 constitutes the lowermost layer of the sealing film 300. The upper-layer inorganic film 330 constitutes the uppermost layer of the sealing film 300. The inorganic material constituting the lower-layer inorganic film 310 and the inorganic material constituting the upper-layer inorganic film 330 may be the same or different. The organic film 320 is formed of an organic material. As the organic material, for example, a resin material such as acrylic or epoxy is preferably used.

Then, as illustrated in FIG. 6, the upper-layer inorganic film 330 of the sealing film 300 includes a wave portion 332 whose cross-section is a wave-shaped portion. In this embodiment, the wave portion 332 is formed in the bending region of the display device 100. That is, by forming the wave portion 332 in the upper-layer inorganic film 330 of the sealing film 300 included in the bending region, bending resistance of the sealing film 300 in the bending region is effectively enhanced.

The wave portion 332 is formed by alternately and repeatedly forming peaks (convex portions) and valleys (concave portions). That is, in the example illustrated in FIG. 6, the peaks and valleys of the wave portion 332 of the upper-layer inorganic film 330 are continuous in the bending direction (that is, the X-direction in the drawing, the second direction D2 in the example illustrated in FIG. 1) of the display device 100. Further, the wave shape of the wave portion 332 is formed by allowing corresponding wave shapes to be formed on the upper and lower surfaces of the upper-layer inorganic film 330.

The wave portion 332 of the upper-layer inorganic film 330 is formed on the plurality of openings 200. Here, in the top emission type display device 100, it is preferable that the influence that light emitted from each opening 200 receives by being transmitted through the wave portion 332 formed on the opening 200 is made uniform among the plurality of openings 200.

Therefore, in this embodiment, a distance W1 between the adjacent peaks and/or a distance W2 between the adjacent valleys included in the wave portion 332 of the upper-layer inorganic film 330 is equal to a distance between the adjacent openings 200.

In this regard, the description will be made by paying attention to two adjacent openings 200a and 200b (hereinafter referred to as "first opening 200a" and "second opening 200b") among the plurality of openings 200, in the example illustrated in FIG. 6.

On the first opening 200a and the second opening 200b adjacent in a bending direction X illustrated in FIG. 6, as a part of the wave portion 332 of the upper-layer inorganic film 330, a first peak having a first convex vertex 336a, a first valley having a first concave vertex 334a, a second peak having a second convex vertex 336b, and a second valley having a second concave vertex 334b are successively formed, in the bending direction X.

The distance W1 (that is, the distance between the first convex vertex 336a and the second convex vertex 336b) between the first peak and the second peak is equal to the distance (that is, the distance between the center point of the first opening 200a in the bending direction X and the center point of the second opening 200b in the bending direction X) between the first opening 200a and the second opening 200b.

The distance W2 (that is, the distance between the first concave vertex 334a and the second concave vertex 334b) between the first valley and the second valley is also equal to the distance between the first opening 200a and the second opening 200b.

Accordingly, by making the shape of the wave portion 332 formed on each opening 200 uniform among the plurality of openings 200, the influence that light emitted from each opening 200 receives by the wave portion 332 is also effectively made uniform among the plurality of openings 200.

The peak or valley included in the wave portion 332 of the upper-layer inorganic film 330 may be disposed at a position corresponding to each opening 200. That is, in the example illustrated in FIG. 6, the valley included in the wave portion 332 of the upper-layer inorganic film 330 is formed at a position corresponding to each opening 200 in the bending direction X. Specifically, the first valley having the first concave vertex 334a is formed at a position corresponding to the first opening 200a, and the second valley having the second concave vertex 334b is formed at a position corresponding to the second opening 200b.

In the example illustrated in FIG. 6, the valley included in the wave portion 332 of the upper-layer inorganic film 330 is formed immediately above each opening 200. Specifically, the first valley is formed immediately above the first opening 200a and the second valley is formed immediately above the second opening 200b.

Furthermore, in the example illustrated in FIG. 6, the concave vertex 334 of the valley included in the wave portion 332 of the upper-layer inorganic film 330 is formed at a position corresponding to the center of each opening 200 in the bending direction. Specifically, in the first valley, the first concave vertex 334a thereof (center position in the bending direction X of the first valley) is formed at a position corresponding to the center in the bending direction X of the first opening 200a. In the second valley, the second concave vertex 334b thereof is formed at a position corresponding to the center in the bending direction X of the second opening 200b.

Similarly, the peak included in the wave portion 332 of the upper-layer inorganic film 330 may be formed at a position corresponding to each opening 200. Specifically, for example, the first peak having the first convex vertex 336a may be formed at a position corresponding to the first opening 200a, and the second peak having the second convex vertex 336b may be formed at a position corresponding to the second opening 200b.

The peak included in the wave portion 332 of the upper-layer inorganic film 330 may be formed immediately above each opening 200. Specifically, for example, the first peak may be formed immediately above the first opening 200a and the second peak may be formed immediately above the second opening 200b.

Further, the convex vertex 336 of the peak included in the wave portion 332 of the upper-layer inorganic film 330 may be formed at a position corresponding to the center of each opening 200 in the bending direction. Specifically, in the first peak, the first convex vertex 336a thereof (center position in the bending direction X of the first peak) may be formed at a position corresponding to the center in the bending direction X of the first opening 200a, and in the second peak, the second convex vertex 336b thereof may be formed at a position corresponding to the center in the bending direction X of the second opening 200b.

As described above, in this embodiment, the sealing film 300 of the display device 100 includes the organic film 320.

Further, the organic film 320 includes a wavy surface 322 as illustrated in FIG. 6. Further, the wave portion 332 of the upper-layer inorganic film 330 is formed on the wavy surface 322 of the organic film 320.

As illustrated in FIG. 6, on the wavy surface 322 of the organic film 320, peaks (convex portions) and valleys (concave portions) are formed alternately and repeatedly. Similarly to the wave portion 332 of the upper-layer inorganic film 330 described above, the distance W1 between adjacent peaks and/or the distance W2 between adjacent valleys included in the wavy surface 322 of the organic film 320 is equal to the distance between the adjacent openings 200.

That is, when focusing on the first peak having a first convex vertex 326a, the first valley having a first concave vertex 324a, the second peak having a second convex vertex 326b, and the second valley having a second concave vertex 324b, which are successively continuous in the bending direction X, among the plurality of peaks and valleys included in the wavy surface 322, the distance W1 between the first peak and the second peak (that is, the distance between the first convex vertex 326a and the second convex vertex 326b) and the distance W2 between the first valley and the second valley (the distance between the first concave vertex 324a and the second concave vertex 324b) are both equal to the distance between the first opening 200a and the second opening 200b.

In manufacturing the display device 100, first, the wavy surface 322 of the organic film 320 is formed, and then, the upper-layer inorganic film 330 is formed on the wavy surface 322. Thus, the wave portion 332 having the wave shape corresponding to the wavy surface 322 is formed on the wavy surface 322 as a part of the upper-layer inorganic film 330.

Here, the wavy surface 322 of the organic film 320 is formed, for example, by forming the uncured wavy surface 322 using an organic material first, and then curing the organic material.

Specifically, for example, when the organic film 320 is formed by coating a raw material droplet of the organic film 320 on the lower-layer inorganic film 310, first, a surface in which concave and convex surfaces are alternately continuous is formed by alternately coating, in the bending direction X, a first amount of the raw material droplet corresponding to the valley and a second amount of the raw material droplet that is larger than the first amount and corresponds to the peak, and then the wavy surface 322 is formed by curing the raw material droplets.

For example, the wavy surface 322 may be formed by forming an uncured organic film having a flat surface using an uncured organic material first, and then forming a wavy surface corresponding to the surface of a mold having a wavy surface corresponding to the wavy surface 322 by pressing the mold against the flat surface of the uncured organic film, and thereafter, curing the organic material and detaching the mold from the wavy surface.

For example, the wavy surface 322 may be formed by a chemical vapor deposition (CVD) method using a halftone mask corresponding to the wavy surface 322. Further, for example, the wavy surface 322 may be formed by coating an organic material using an inkjet technique.

Then, by forming the upper-layer inorganic film 330, by vapor deposition or the like, on the organic film 320 including the wavy surface 322 formed in this way, the wave portion 332 of the upper-layer inorganic film 330 is formed on the wavy surface 322.

The upper-layer inorganic film 330 may include a flat portion 338 having a flat cross-section in addition to the wave portion 332. That is, in the example illustrated in FIG. 6, the upper-layer inorganic film 330 includes the flat portion 338 that continues to the wave portion 332. Specifically, the flat portion 338 is formed on one side and the other side of the wave portion 332 in the bending direction X. The flat portion 338 may be formed only on one side of the wave portion 332 in the bending direction X.

As illustrated in FIG. 6, when the upper-layer inorganic film 330 includes the flat portion 338, the organic film 320 includes a flat surface 328 corresponding to the flat portion 338 in addition to the wavy surface 322. That is, in this case, the wave portion 332 of the upper-layer inorganic film 330 is formed on the wavy surface 322 of the organic film 320, and the flat portion 338 of the upper-layer inorganic film 330 is formed on the flat surface 328 of the organic film 320.

The wave portion 332 of the upper-layer inorganic film 330 may be formed in a region where the display device 100 is bent, and the flat portion 338 of the upper-layer inorganic film 330 may be formed in a region other than the bending region of the display device 100. In this case, the wave portion 332 of the upper-layer inorganic film 330 may also be formed in the region other than the bending region of the display device 100.

When the entire display region 102 of the display device 100 is the bending region, the upper-layer inorganic film 330 may include the wave portion 332 formed on the entire display region 102. That is, in this case, the upper-layer inorganic film 330 does not include the flat portion 338 in the display region 102.

As described above, the sealing film 300 is formed on the upper electrode 230 that is a common electrode, and includes the lower-layer inorganic film 310 formed below the upper-layer inorganic film 330 and on the upper electrode 230.

In the example illustrated in FIG. 6, the lower-layer inorganic film 310 includes a first portion 312 having a first thickness and a second portion 314 having a second thickness smaller than the first thickness and formed below the wave portion 332 of the upper-layer inorganic film 330.

The range in which the second portion 314 of the lower-layer inorganic film 310 is formed is not particularly limited as long as it corresponds to the wave portion 332 of the upper-layer inorganic film 330, but the second portion 314 may also be formed in a range narrower than the wave portion 322, as illustrated in FIG. 6.

As described above, the lower-layer inorganic film 310 includes the second portion 314 having a reduced thickness within the range where the wave portion 332 of the upper-layer inorganic film 330 is formed, thereby effectively increasing the bending resistance of the lower-layer inorganic film 310.

In this embodiment, the display device 100 includes the touch panel electrode 110 formed on the sealing film 300. Specifically, in the example illustrated in FIG. 6, the planarization layer 74 is formed on the sealing film 300, and the touch interlayer insulating film 76 including the touch panel electrode 110 is formed on the planarization layer 74.

The touch panel electrode 110 is disposed at a position that does not overlap the opening 200 in plan view. That is, in the example illustrated in FIG. 6, the touch panel electrode 110 is formed at the position corresponding to the rib 240 surrounding the opening 200.

Specifically, for example, a first touch panel electrode 110a is formed at a position corresponding to a first rib 240a, and a second touch panel electrode 110b is formed at a position corresponding to a second rib 240b.

As a result, the first touch panel electrode 110a and the second touch panel electrode 110b are not disposed at positions corresponding to the opening 200 such as the first opening 200a and the second opening 200b.

As such, the touch panel electrode 110 is disposed at the position at which the touch panel electrode 110 does not overlap the opening 200, thereby effectively avoiding a problem caused by the touch panel electrode 110 blocking light emission from the opening 200.

In this embodiment, the display device 100 includes the polarizing plate 80. That is, in the example illustrated in FIG. 6, the polarizing plate 80 is formed on the touch interlayer insulating film 76. Specifically, the front lamination film 78 is formed on the touch interlayer insulating film 76 and the polarizing plate 80 is formed on the front lamination film 78.

The polarizing plate 80 includes a polarizer. As the polarizer, for example, an iodine-based polarizer such as a polarizer having an iodine complex is preferably used. The polarizing plate 80 suppresses a decrease in visibility of the display device 100 due to external light.

The front lamination film 78 is formed as an adhesion layer that promotes adhesion between the touch interlayer insulating film 76 and the polarizing plate 80. For this reason, the front lamination film 78 is formed of a material suitable for adhesion between the touch interlayer insulating film 76 and the polarizing plate 80 (for example, an organic material that functions as a paste).

Although an example in which the display device is an organic EL display device has been described in this embodiment, the display device according to the present invention is not limited thereto, and may be any flat panel display device such as a self-luminous display device such as a liquid crystal display device or an electronic paper display device having electrophoretic elements. Needless to say, the present invention can be applied to a display device having any size from a small and medium size to a large size without any particular limitation.

It is naturally understood that other effects brought about by the aspect described in the present embodiment, which are clear from the description of the present specification, or those that can be conceived appropriately by those skilled in the art, are brought about by the present invention.

What is claimed is:

1. A display device comprising:
a plurality of pixels, each pixel having an opening; and
a sealing film formed on the plurality of pixels, wherein
the sealing film includes a first inorganic film, a second inorganic film disposed below the first inorganic film and an organic film disposed between the first inorganic film and the second inorganic film,
the first inorganic film includes a wave portion whose cross section is a wave-shaped portion,
the organic film includes a wavy surface, and
the wave portion of the first inorganic film is formed on the wavy surface of the organic film.

2. The display device according to claim 1, wherein
a distance between adjacent peaks and/or a distance between adjacent valleys included in the wave portion of the first inorganic film is equal to a distance between the adjacent openings.

3. The display device according to claim 1, wherein
the peak or valley included in the wave portion of the first inorganic film is disposed at a position corresponding to each of the openings.

4. The display device according to claim 1, wherein
the sealing film includes an organic film,
the organic film includes a wavy surface, and the wave portion of the first inorganic film is formed on the wavy surface of the organic film.

5. The display device according to claim 1; further comprising:
a common electrode formed across the plurality of pixels, wherein
the sealing film is formed on the common electrode, and
the second inorganic film includes a first portion having a first thickness and a second portion having a second thickness smaller than the first thickness and formed below the wave portion of the first inorganic film.

6. The display device according to claim 1, further comprising:
a touch panel electrode formed on the sealing film, wherein
the touch panel electrode is disposed at a position not overlapping the opening of the pixel.

* * * * *